(12) United States Patent
Unruh

(10) Patent No.: US 9,407,270 B2
(45) Date of Patent: Aug. 2, 2016

(54) METHOD AND APPARATUS FOR CONTROL OF A DIGITAL PHASE LOCKED LOOP (DPLL) WITH EXPONENTIALLY SHAPED DIGITALLY CONTROLLED OSCILLATOR (DCO)

(71) Applicant: Broadcom Corporation, Irvine, CA (US)

(72) Inventor: Gregory Alyn Unruh, San Clemente, CA (US)

(73) Assignee: BROADCOM CORPORATION, Irvine, CA (US)

( * ) Notice: Subject to any disclaimer, the term of this patent is extended or adjusted under 35 U.S.C. 154(b) by 6 days.

(21) Appl. No.: 13/931,997

(22) Filed: Jun. 30, 2013

(65) Prior Publication Data

US 2014/0368242 A1 Dec. 18, 2014

Related U.S. Application Data

(60) Provisional application No. 61/834,086, filed on Jun. 12, 2013.

(51) Int. Cl.
*H03L 7/06* (2006.01)
*H03L 1/00* (2006.01)
*H03L 7/099* (2006.01)
*H03L 7/107* (2006.01)

(52) U.S. Cl.
CPC ............... *H03L 1/00* (2013.01); *H03L 7/0995* (2013.01); *H03L 7/1077* (2013.01); *H03L 2207/50* (2013.01)

(58) Field of Classification Search
CPC ........................................................ H03L 7/08
USPC ............................................ 327/156; 331/57
See application file for complete search history.

(56) References Cited

U.S. PATENT DOCUMENTS

| | | | | |
|---|---|---|---|---|
| 6,525,569 | B1 * | 2/2003 | Leon | H03K 17/163 326/29 |
| 6,850,124 | B1 * | 2/2005 | Li | H03L 7/093 331/17 |
| 2004/0251973 | A1 * | 12/2004 | Ishida | H03K 3/0315 331/16 |
| 2008/0069292 | A1 * | 3/2008 | Straayer | G04F 10/005 377/46 |
| 2008/0164950 | A1 * | 7/2008 | Kelkar | H03L 7/0995 331/16 |
| 2012/0042176 | A1 * | 2/2012 | Kim | 713/300 |
| 2012/0068743 | A1 * | 3/2012 | Youssef | H03L 7/099 327/156 |
| 2013/0033331 | A1 * | 2/2013 | Raghunathan | H03K 3/0315 331/49 |

* cited by examiner

*Primary Examiner* — Sibin Chen
*Assistant Examiner* — Metasebia Retebo
(74) *Attorney, Agent, or Firm* — Oblom, McClelland, Maier & Neustadt, L.L.P.

(57) ABSTRACT

Various systems and methods utilizing a digitally controlled oscillator having frequency steps that increase in magnitude as a target output clock frequency increases are described. An integrated circuit in accordance with the disclosure includes a plurality of first transistor units fixedly coupled to an input voltage and a plurality of second transistor units switchably coupled to the first transistor units. An output coupled to the plurality of second transistor units and the plurality of first transistor units conveys an output signal having a frequency dependent on which select ones of the second transistor units are enabled. The plurality of second transistor units include a first switchable transistor unit having a transistor of a first width, a second switchable transistor unit having a transistor of a second width greater than the first width, and a third switchable transistor unit having a transistor of a third width greater than the second width.

18 Claims, 8 Drawing Sheets

METHOD AND APPARATUS FOR CONTROL OF A DIGITAL PHASE LOCKED LOOP (DPLL) WITH EXPONENTIALLY SHAPED DIGITALLY CONTROLLED OSCILLATOR (DCO)

TECHNICAL FIELD

The present disclosure relates to systems and methods for controlling frequency output of a digital phase locked loop using a digitally controlled oscillator having frequency steps that increase in magnitude as a target output clock frequency increases.

BACKGROUND

Mobile wireless communication devices such as cellular telephones, smartphones, personal digital assistants (PDAs), etc. are typically configured to communicate with other devices over a multitude of different frequencies. As such, mobile wireless communication devices, as well as the devices with which they communication are required to include circuitry capable of generating wireless communication signals at a multitude of different frequencies. Typically, information, such as voice or data, is modulated or encoded on a carrier wave of a certain frequency and the modulated or encoded carrier wave is transmitted from one device to another. In many applications, frequency modulation or phase modulation is used to encode the information onto the carrier wave. In order to maintain a communication session with another device and accurately encode and decode the information to and from the carrier wave, the mobile communication device and the device with which it is communicating "lock" on a selected communication frequency. In many embodiments, a digital phase locked loop (DPLL) is used for generating and locking on a communication frequency and at the heart of the DPLL is a digitally controlled oscillator (DCO) that is designed to generate digital clock signals over a wide range of frequencies. The range of clock frequencies generated by the DCO can depend on the range of Processing, Voltage and Temperature (PVT ranges) that the DCO can be expected to experience. The larger the expected PVT ranges, the larger the range of output clock frequencies that the DCO should be able to produce, at typical PVT conditions, and hence the more complex the circuitry of the DCO.

BRIEF DESCRIPTION OF THE DRAWINGS

For a more complete understanding of example embodiments of the present disclosure, reference is now made to the following descriptions taken in connection with the accompanying drawings in which.

DETAILED DESCRIPTION OF THE DISCLOSURE

Figure 1:
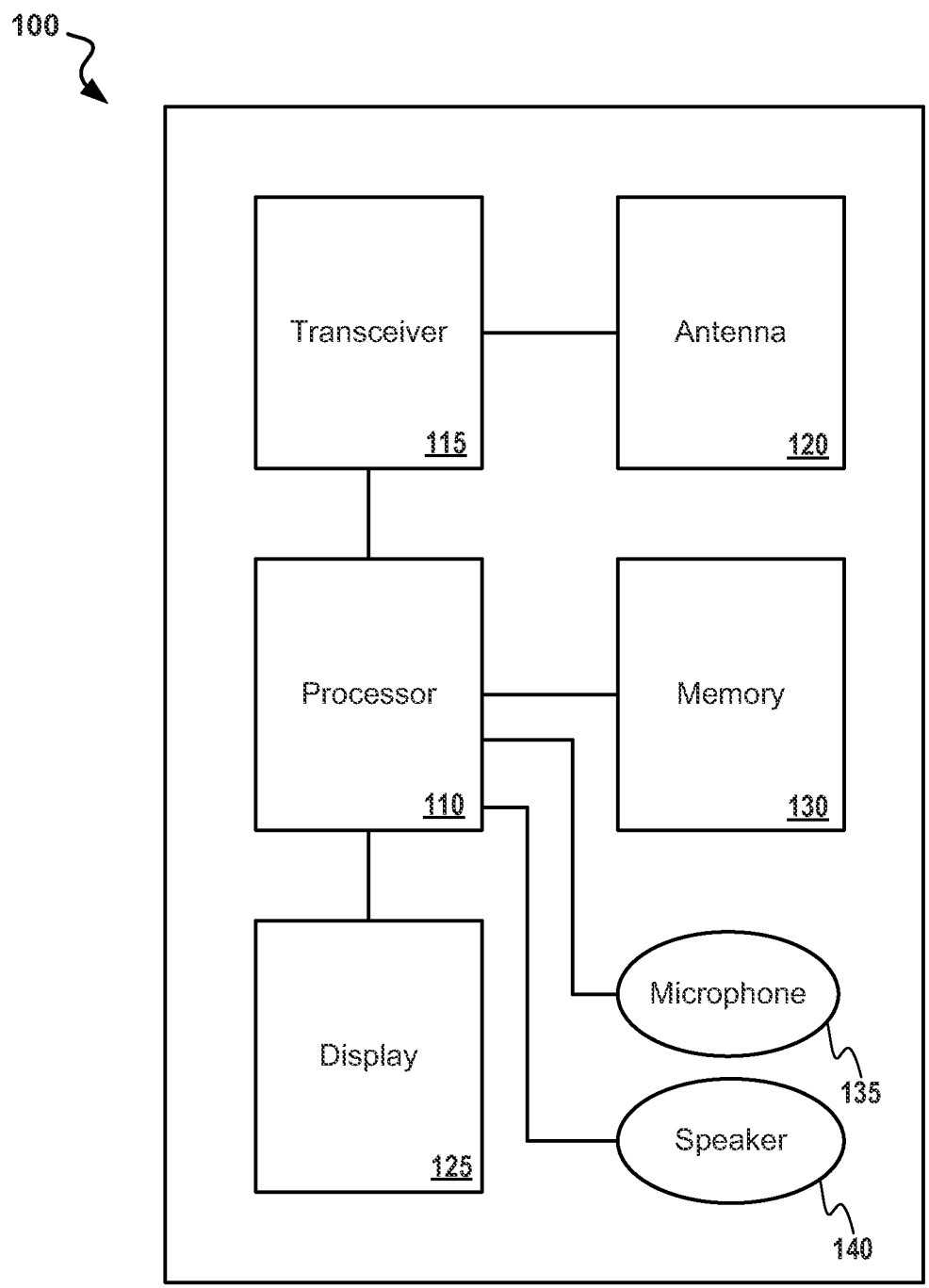
FIG. 1 illustrates a block diagram of an exemplary communication device that utilizes a digitally controlled oscillator having frequency steps that increase in magnitude as a target output clock frequency increases.

FIG. 1 is a block diagram of an exemplary communication device 100 that can utilize a digitally controlled oscillator having frequency steps that increase in magnitude as a target output clock frequency increases. Referring to FIG. 1, the communication device 100 may include a processor 110, memory 130, a transceiver 115 and one or more antennas 120. The example communication device 100 may also include a display 125, a microphone 135 and a speaker 140.

The communication device 100 and its components may comprise suitable logic, circuitry, interfaces and/or code that may be operable to perform at the least the functions, operations and/or methods described herein. The communication device 100 may be part of a base station (BS) or part of a user equipment (UE) in a wireless communication system. In an exemplary 3GPP wireless communication system, the BS may be referred to as a node B (NB) (eNB in LTE). In an example multi-input/multi-output (MIMO) communication system, the BS may be referred to as an access point (AP). The UE may be referred to as a station (STA). An AP and/or STA may be utilized in wireless local area network (WLAN) systems.

The one or more antennas 120 may enable the communication device 100 to transmit and/or receive signals, for example RF signals, via a wireless communication medium. The communication device may also be depicted as comprising one or more transmitting antennas, and one or more receiving antennas without loss of generality.

The memory 130 may include a computer-readable memory including removable and non-removable storage devices including, but not limited to, Read Only Memory (ROM), Random Access Memory (RAM), compact discs (CDs), digital versatile discs (DVD), etc. The memory 130 can include program modules that perform particular tasks as described herein. Computer-executable instructions, associated data structures, and program modules represent examples of program code for being executed by the processor 110 to perform steps of the methods disclosed herein.

The processor 110 can be configured to control overall operation and/or configuration of the communication device 100. The processor 110 can also be configured to execute one or more applications such as SMS for text messaging, electronic mailing, audio and/or video recording, and/or other software applications such as a calendar and/or contact list to provide some examples. The processor 110 may receive information from, among other things, the display 125, microphone 135, and/or speaker 140. The processor 110 may also receive information from other electrical devices, such as the transceiver 115, or host devices that are coupled to the communication device 100. The processor 110 can be configured to provide this information to the transceiver 115, display 125, microphone 135, and/or speaker 140.

The display 125, microphone 135, and speaker 140 can be configured as a user interface for the communication device 100 capable of receiving user input and providing information output to the user. For example, in the case of a mobile telephone, the microphone 135 can be used for receiving voice data from the user and the speaker 140 can be used for presenting voice data to the user. The microphone 135 and speaker 140 can also be configured for receiving and confirming verbal commands. The display 125 can be configured as a touch-screen display, an alphanumeric keypad, a mouse, or another suitable input/output device. User provided information can be input into the communication device 100 such as by typing on the alphanumeric keypad, typing or selecting on the touch-screen display, selecting with the mouse, and/or through other methods of receiving user input. Information can be provided to the user by displaying the information on the touch-screen display or through other method of conveying and/or displaying information.

The transceiver 115 can be configured to send and receive electrical signals via the antenna 120. In general, the transceiver 115 can be configured to encode information, such as voice or data, onto a carrier wave and send the encoded signal via the one or more antennas 120 to another device which, upon receipt, decodes the information from the carrier wave. In a similar manner, the transceiver 115 can be configured to receive an encoded signal via the one or more antennas 120, decode information, such as voice and/or data, from the encoded signal, and pass along the decoded information to the processor 110 for processing and/or presentation to the user.

Figure 2:
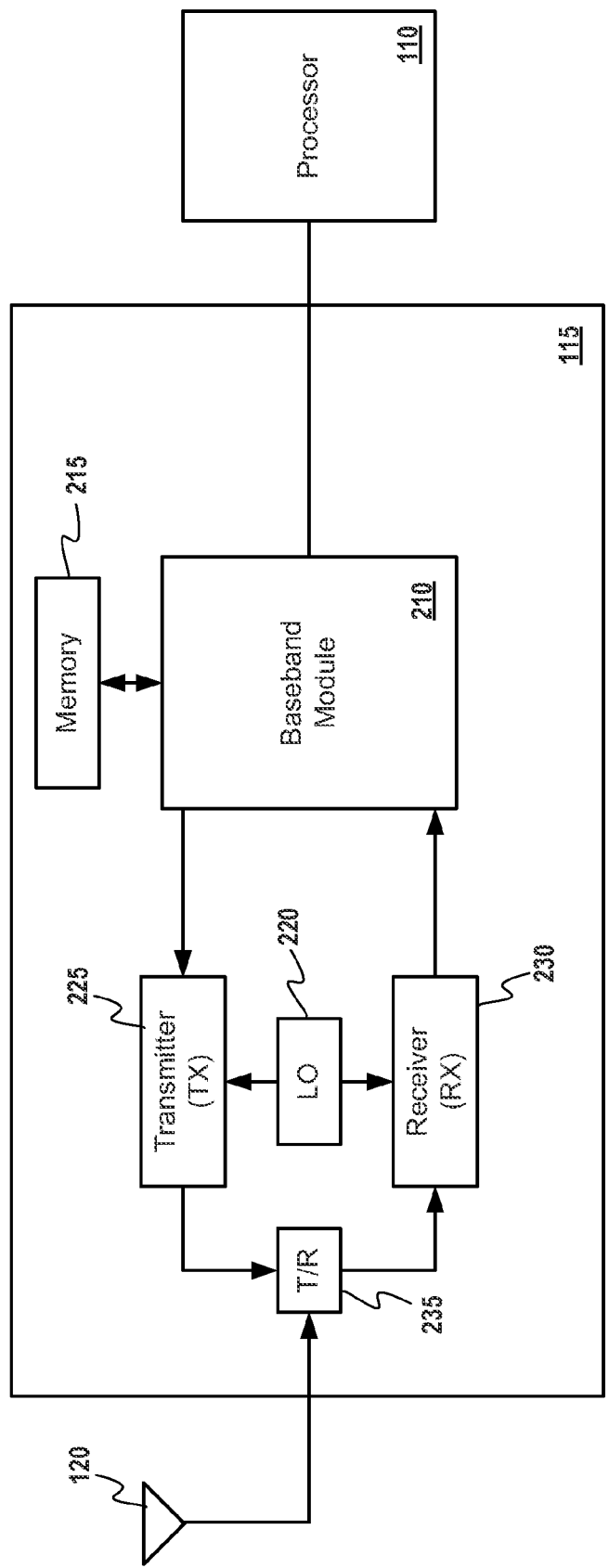
FIG. 2 illustrates a block diagram of an exemplary transceiver that utilizes a digitally controlled oscillator having frequency steps that increase in magnitude as a target output clock frequency increases.

FIG. 2 illustrates a block diagram of an exemplary transceiver 115 that can be utilized in the communication device of FIG. 1. The example transceiver 115 includes a baseband module 210 coupled to the processor 110 and a memory 215. The memory 215 can be a part of the memory 130 in FIG. 1 or separate memory. The processor 110 causes the baseband module 210 to modulate data (e.g., data representing voice received from the microphone 135 or data stored in the memory 215) to be transmitted via a transmitter 225 and the one or more antennas 120. The processor 110 can also cause the baseband module 210 to demodulate data representing voice and or any form of media that is received via a receiver 230 and the one or more antennas 120. The modulated data is received from and communicated to the antenna 120 via a duplexer 235.

The transmitter 225 may enable the generation of signals, which may be transmitted via selected antennas 120. The transmitter 225 may generate signals by performing coding functions and/or signal modulation. The receiver 230 may enable the processing of signals received via the selected antennas 120. The receiver 230 may generate data based on the received signals by performing signal amplification, signal demodulation and/or decoding functions.

A local oscillator 220 may be a variable frequency DCO that is configured to generate a carrier signal that is used to up-convert or down-convert signals to be transmitted or received by one or more selected antennas 120. The local oscillator 220 is controlled by the processor 110 to produce a frequency that is matched to the selected antenna(s) 120 such that a radio signal is properly shifted up to or down from a selectable carrier frequency. The local oscillator 220 may include a variable frequency DCO having frequency steps that increase in magnitude as a target output clock frequency increases in accordance with the disclosure. The local oscillator 220 is but one example of a system that can employ systems and methods described herein. The systems and methods described herein can also be used to provide clocks to processors, memory, displays, analog or digital modules or any other clocking applications.

Figure 3:
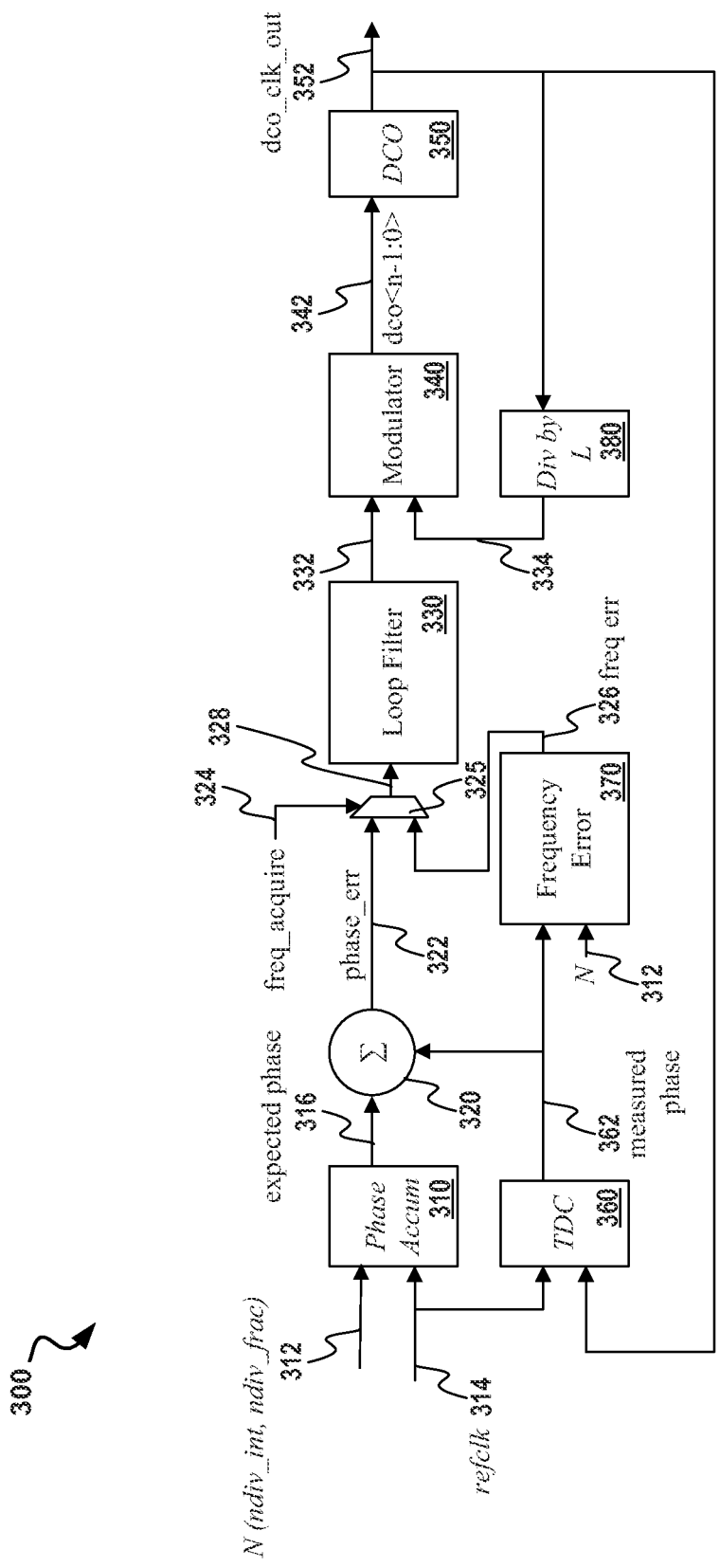
FIG. 3 illustrates a block diagram of an exemplary digital phase locked loop (DPLL) that utilizes a digitally controlled oscillator having frequency steps that increase in magnitude as a target output clock frequency increases.

FIG. 3 illustrates a block diagram of an exemplary digital phase locked loop (DPLL) 300 that utilizes a DCO having frequency steps that increase in magnitude as a target output clock frequency increases. PLLs (both analog and digital versions) are feedback control systems that can include an oscillator (e.g., a voltage or current controlled oscillator (VCO or ICO) in an analog PLL or a DCO in a DPLL), a phase-frequency detector, and a low pass filter within a closed loop. The purpose of the feedback control system is to force the oscillator to replicate and track the frequency and phase of an input reference clock when in a locked-in state. It is possible to have a phase offset between input and output, but when locked-in, the frequencies can track nearly exactly. The example DPLL 300 has 2 modes of operation. When the signal freq_acquire 324 is '1', then the feedback control allows the PLL to pull-in to the target frequency from an arbitrary starting frequency. When this freq_acquire signal 324 is '0', the PLL feedback control maintains the relative phase between dco_clk_out 352 and refclk 314.

One application of DPLL 300 is to provide a local oscillator (e.g., the local oscillator 220) up-conversion during transmission and down-conversion during reception. In the DPLL 300, the phase-frequency detector may be a combination of a phase accumulator 310, a time-to-digital converter (TDC) 360, a digital frequency error calculator 370 (which performs a time-derivative calculation), a combiner 320 and a multiplexer 325. These components use a reference clock input signal (refclk) 314 and a digital multiplier (N) 312, where the digital multiplier N 312 includes an integer multiplier component ndiv_int and a fractional multiplier component ndiv_frac.

The digital multiplier N 312 is used by the phase accumulator 310 to scale the refclk input 314 to any desired frequency by multiplying the number of input cycles of refclk 314 by N 312. The output of the phase accumulator 310 is a digital expected phase signal 316 of the scaled input refclk signal 314. The expected phase signal 316 is forwarded to the combiner 320.

The TDC 360 receives two input signals, the refclk signal 314 and DCO clock output signal 352 (vco_clk_out) from a DCO 350. The TDC 360 uses the refclk signal 314 as a reference frequency. The TDC 360 counts the clock cycles of the vco_clk_out signal 352 and determines a measured phase of the vco_clk_out signal 352 for a specified number of cycles of the refclk signal 314. The measured phase signal 362 can include an integer count component and a fractional count component. When freq_acquire 324 is '1', the measured phase signal 362 determined by the TDC 360 is then utilized by the frequency error calculator 370 to determine freq_err 326. When freq_acquire 324 is '0', the measured phase signal 362 determined by the TDC 360 is then utilized by the combiner 320 to determine phase_err 322.

The combiner 320 receives the expected phase signal 316 from the phase accumulator 310 and receives the measured phase signal 362 from the TDC 360. The combiner 320 can combine these input signals by subtracting the measured phase signal 362 from the expected phase signal 316 to arrive at a phase error signal 322. The phase error signal 322 can include both an integer count component and a fractional count component. The phase error signal 322 is forwarded from the combiner 320 to the multiplexer 325.

The frequency error calculator 370 receives the measured phase signal 362 from the TDC 360 and also can receive the multiplier input N 312. The frequency error calculator 370 performs a time derivative calculation on the measured phase signal 362 in order to calculate a frequency error signal 326. The frequency error calculator 370 can use z-transform methods, for example, to calculate the frequency error signal 326 based on a current value of the measured phase signal 362 and one or more past values. For example, a typical frequency error calculation base on the a current value and a single past value of the measured phase signal 362 can be based on the following z-transform equation:

$$\text{freq\_err}=N-\text{measured\_phase}*(1-z^{-1}) \quad (1)$$

Equation 1 can be used for any DPLL regardless of the nature of the other components of the DPLL. However, as further described below, the DPLL 300 can use an exemplary DCO 350 that utilizes frequency steps that increase exponentially with the target frequency. In this example DCO 350, the frequency error calculator 370 can determine the frequency error 326 based on the following z-transform equation:

$$\text{freq\_err}=\log 2(N)-\log 2(\text{measured\_phase}*(1-z^{-1}))- \quad (2)$$

Equation (2) takes advantage of the knowledge that the DCO 350 includes exponentially increasing frequency steps and can allow for consistent acquisition of a target frequency, across PVT variations.

The multiplexer 325 receives the freq_acquire signal 324 which selects between the phase error signal 322 (when freq_acquire=0), and the frequency error signal 326 (when freq_acquire=1), to provide a combined error signal 328.

The combined error single 328 is forwarded to a loop filter 330. A primary function of the loop filter 330 is to ensure loop dynamics or stability. This determines how the loop responds to disturbances, such as changes in the target frequency, changes of the multiplier input N 312, changes in the PVT characteristics, or at startup. Some possible considerations in designing the loop filter 330 include the range over which the loop filter 330 can achieve lock (pull-in range, lock range or capture range), how fast the loop filter 330 achieves lock (lock time, lock-up time or settling time) and damping behavior. Depending on the application, this may require one or more of the following: a simple proportion (gain or attenuation), an integral (low pass filter) and/or derivative (high pass filter). Loop parameters commonly examined for this are the loop's gain margin and phase margin. Common concepts in control theory can be used to design the loop filter 330 and the DCO provides equally sized frequency steps.

In the example DPLL 300, the loop filter 330 can be represented by the following example z-transform expression:

$$\text{filt\_err}=\text{comb\_error}(Ki*(1/z-1)+Kp) \quad (3)$$

where comb_error is the combined error signal 328 output by the multiplexer 325, filt_err is a filtered error 332 output by the loop filter 330 and Ki and Kp are gains of the loop filter 330. The gains Ki and Kp may need to be adjusted for different target frequencies. However, for the example DPLL that utilizes an exponentially shaped DCO 350, and when the PLL is operating near its target frequency the Ki and Kp gains should be able to be maintained across an entire PVT range, Furthermore, when the DPLL is acquiring its target frequency, as indicated by freq_acquire 324=1, Ki and Kp gains should also be able to be maintained across an entire PVT range if equation (2) above is used for the frequency error calculator 370.

The filtered frequency error 332 is output to a modulator 340. The modulator 340 determines a DCO control word 342 based on the magnitude of the filtered error 332. Details of the DCO control word 342 are described below. The modulator 340 could be a pulse width or pulse density modulator. For example, the modulator 340 could be used to convert a 16-bit filtered error signal 332 to an 8-bit DCO control word 342. The modulator 340 also receives a converted clock signal 334 input that is determined by a modulator clock divider 380. The modulator clock divider 380 applies a 1/L scaling to the DCO clock output 352 and the resulting converted clock signal 334 drives the modulator clock.

The DCO control word 342 is forwarded to the DCO 350. As will be described below, the DCO control word controls which switches are enabled and/or disabled to properly adjust the DCO clock output 352 to counter the filtered error 332. The DCO control word 342 will vary based on the design of the DCO 350. In a first configuration, the frequency steps provided by the DCO 350 can increase in size as the target frequency increases. In a second configuration, the frequency steps can increase in size in an exponential fashion, as the target frequency increases. In a third configuration, the frequency steps can increase based on a piece-wise quadratic function that may emulate an exponential formula.

Figure 4:
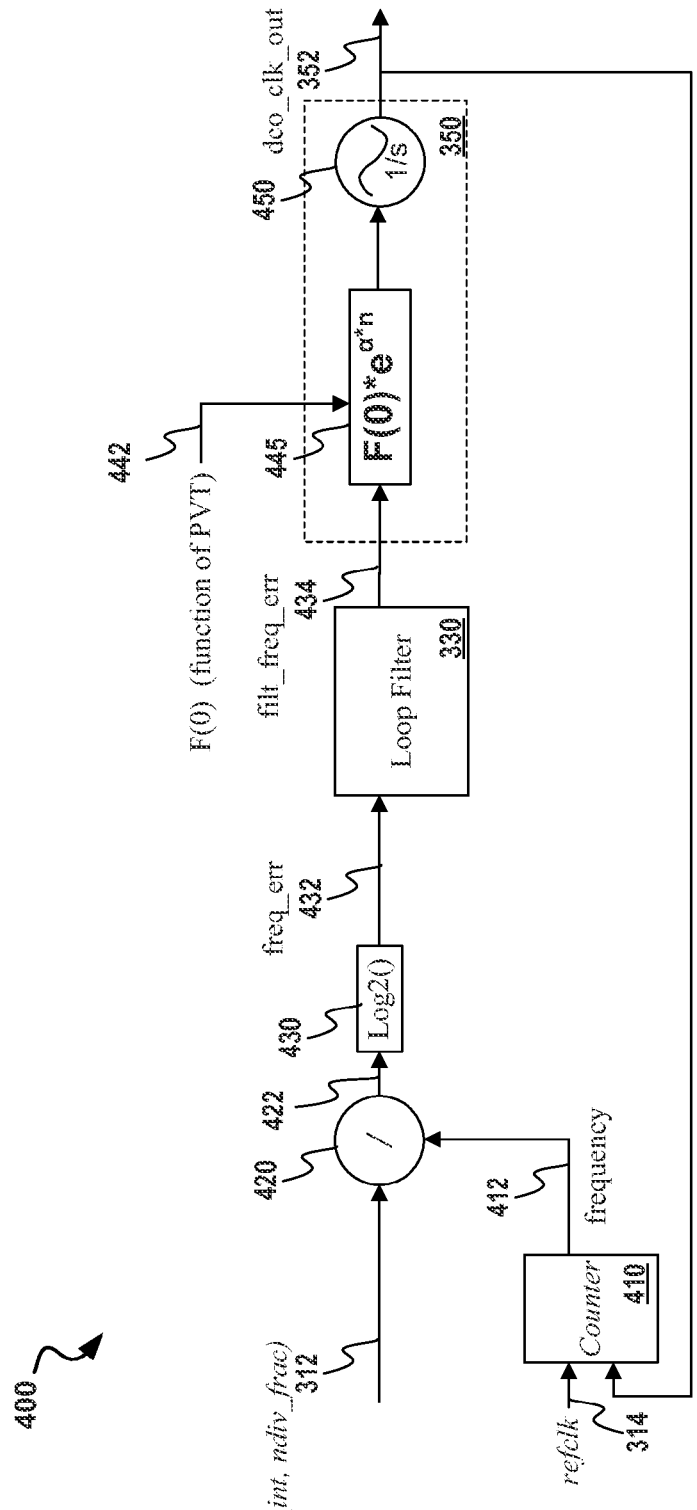
FIG. 4 illustrates a block diagram of an exemplary acquisition-phase digital phase locked loop (DPLL) that utilizes a digitally controlled oscillator having frequency steps that increase in magnitude as a target output clock frequency increases.

The DPLL 300 represents an example closed loop PLL that has both a frequency acquisition mode (freq_acquire=1), and a phase tracking mode (freq_acquire=0). FIG. 4 illustrates a block diagram of an exemplary acquisition-phase DPLL 400 that can utilize a DCO having frequency steps that increase in magnitude as a target output clock frequency increases. The acquisition-phase DPLL 400 can be a simplified or degenerate form of the DPLL 300 of FIG. 3. The DPLL 400 can receive the same multiplier input N 312 as the DPLL 300. The TDC 360 of the DPLL 300 can be replaced by a simple counter 410 that may count the cycles of the DCO clock output 352 during each cycle of the reference clock input 314. The counter 410 outputs the frequency count 412 to a DPLL combiner 420. The DPLL combiner 420 divides the frequency count 412 into the multiplier input N 312 resulting in a DPLL combiner output 422.

A logarithm computation 430 replaces the frequency error calculator 370 of the DPLL 300. The logarithm computation can utilize either of the following expressions to compute a frequency error 432:

$$\text{freq\_err}=\text{Log 2}(N/\text{frequency}) \quad (4a)$$

$$\text{freq\_err}=\text{Log 2}(N)-\text{Log 2}(\text{frequency}) \quad (4b)$$

Where freq_error is the output frequency error 432 computed by the logarithm computation 430, N is the multiplier input 312 and frequency is the frequency count 412 output by the counter 410. The frequency error 432 is forwarded to the loop filter 330. The loop filter 330 is, in this example acquisition-phase DPLL 400, the same loop filter 330 as used in the DPLL 300, but with modified gains. In reference to expression (3) above, the loop filter 330 used during the acquisition-phase sets Ki equal to an acquisition gain Ka and sets Kp equal to zero. The loop filter 330 outputs a filtered frequency error 434 to the DCO 350.

In the example acquisition-phase DPLL 400, the DCO 350 uses an oscillator 450 that is driven by an exponential control function 445. The exponential control function 445 produces a frequency control that increases exponentially in size as the desired frequency increases above a low-frequency set point 442 referred to as F(0). The low-frequency set point 442 is dependent on the operating conditions PVT being experienced. As is discussed below, in one example current driven DCO, the DCO 350 includes a certain number of fixed (always on) current sources that will produce a different F(0) 442 depending on the PVT being experienced. The F(0) frequency 442 is shown as an input to control function 445 because the DCO 350 will need to make up for the effects of PVT on the F(0) frequency 442 in order to arrive at the correct DCO output clock 352. The control function 445 does not really use the F(0) frequency 442 in any computation, but the F(0) resulting from the current PVT does affect the action of the DCO 350 and the F(0) frequency is therefore shown as an input. The gain of the exponential control function 445 in the example DCO can be easily computed for any frequency error as will be described in reference to FIG. 6 below.

The exponential control function 445 is controlled to compensate for the filtered frequency error 434. Details of an exemplary exponential control function 445 are described below in reference to FIG. 6. The current produced by an exponential current source drives, in this example, a current controlled oscillator to output the resulting DCO clock output 352.

The example acquisition-phase DPLL 400 can use any implementation of oscillator with exponentially weighted control codes, such as a variable current DCO, as described below in reference to FIGS. 5 and 6, or a variable gate strength DCO as described below in reference to FIGS. 7A and 7B.

Figure 5:
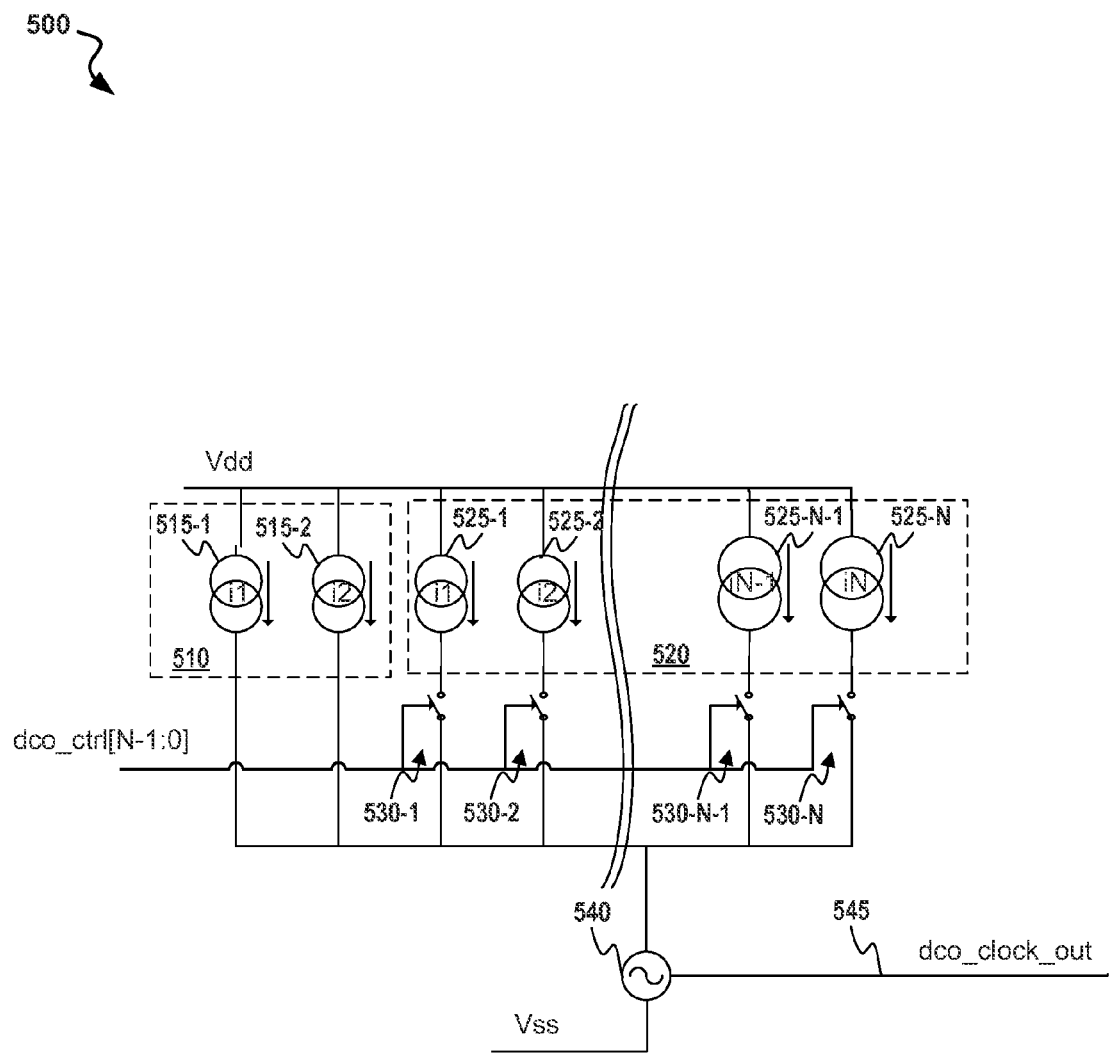
FIG. 5 illustrates a block diagram of an exemplary variable current DCO that utilizes a switchable digital-to-analog-current (DAC) array for providing frequency steps that increase in magnitude as a target output clock frequency increases.

FIG. 5 illustrates a block diagram of an exemplary variable current DCO 500 that utilizes a switchable digital-to-analog current (DAC) array for providing frequency steps that increase in magnitude as a target output clock frequency increases. The variable current source DCO 500 can be used, for example, as the DCO 350 of the DPLL 300 and/or the DCO 350 of the acquisition-phase DPLL 400 described above.

The variable current DCO 500 includes a fixed current source array 510 that includes a first fixed current source 515-1 and a second fixed current source 515-2. The fixed current sources 515 are always on and provide the low set-point frequency F(0) discussed above. The magnitude of the F(0) frequency depends on the PVT conditions that the variable current DCO 500 is experiencing. The example variable current DCO 500 includes two fixed current sources 515, but other DCOs can include fewer or more fixed current sources 515.

The variable current DCO 500 also includes a switchable current source array 520 that includes N switchable current sources 525 including a first switchable source 525-1 coupled to a first switch 530-1, a second switchable source 525-2 coupled to a second switch 530-2, an N−1 switchable source 525-(N−1) coupled to an N−1th switch 530-(N−1) and an Nth switchable source 525-N coupled to an Nth switch 530-N.

The switchable current sources 525 are configured to provide ever-increasing steps in frequency. In other words, the second switchable current source 525-2 provides a larger current than the first switchable current source 525-1 and a third switchable source (not shown) provides a larger current than the second switchable source 525-2. In one embodiment, the switchable current sources 525 provide increasing frequency steps that increases exponentially. In this embodiment, a total current provided to a current controlled oscillator (ICO) 540 by the fixed current source array 510 and the enabled switchable current sources 525 of the switchable current source array 520 can cause the ICO to produce a DCO clock output 545 at a frequency given by the following formula:

$$F(x)=F(0)*(1+\delta)^x \quad (5)$$

where F(x) is the frequency of the DCO clock output 545 with the first through $x_{th}$ switches 530 closed, F(0) is the low set-point frequency provided by the fixed current sources 514 and δ is a percentage increase in frequency provided by each switchable current source 525. For example, if δ is chosen to be equal to 0.1 (10%), the frequencies provided by closing the first through $x_{th}$ switches 530 are listed in Table 1:

TABLE 1

| x | F(x) | in % |
|---|---|---|
| 0 | F(0) | — |
| 1 | 1.1 * F(0) | 10% |
| 2 | 1.21 * F(0) | 11% |
| 3 | 1.331 * F(0) | 12.1% |
| 4 | 1.4641 * F(0) | 13.31% |
| 5 | 1.61051 * F(0) | 14.641% |
| 6 | 1.771561 * F(0) | 16.1051 |
| 7 | 1.9487171 * F(0) | 17.71561 |
| 8 | 2.1435888 * F(0) | 19.48717 | where x is the number of the switch 530 that is enabled along with all other switches with an index less than x, F(x) is the resulting frequency of the ICO 540 and AF(x) is the percentage increase in frequency provided by closing the $x_{th}$ switch 530.

As can be seen in Table 1, the exponentially increasing step sizes of the switchable current sources 525 can more than double the frequency of the current controlled oscillator 540 with eight switchable current sources 525. If a variable current DCO were to use current sources that provided equal increases in current (and therefore frequency), this would take more than twelve switchable current sources with each switchable current source providing a fixed 10% increase in current and frequency. Thus, using the exponentially shaped step sizes described above, four fewer switchable current sources 525 may be needed to cover the same frequency range than by using fixed step sized switchable current sources 525. This means that fewer switchable current sources may be needed to cover a range of frequencies necessary to cover a given PVT range. Fewer switchable current sources may save space on an IC board and may save cost in manufacturing the IC board. Though fewer switchable current sources are provided, the error in produced frequency for any frequency will be approximately the same on a percentage basis since the size of the step sizes is a fixed percentage of the target frequency.

Frequency ranges covered by a DPLL, such as DPLL 300, can be required to cover large frequency ranges (typically a range from F(0) to 2.5*F(0)) just to allow all possible frequencies to be replicated with a single reference clock and one or more feedback dividers and/or feed-forward dividers. In addition, DCOs have gains that vary significantly due to variations in (PVT) operating ranges. A DCO should be able to produce frequencies that cover the so called slow and fast corners of a PVT range. The delay of a transistor is affected by the PVT that the transistor is operating in. A typical PVT range of normalized delays (with 1.0 being the average delay) is from 0.625 for a fast corner and 2.0 for a slow corner. Frequency is equal to 1/delay. Therefore for a typical DCO frequency range from 1 GHz to 2.5 GHz, being able to compensate for a slow delay of 2.0 and a fast delay of 0.625, the DCO may need to be able to reproduce frequencies in a range from 0.625 GHz (0.625 GHz/0.625=1.0 GHz) to 5.0 GHz (2.5 GHz/0.5=5.0 GHz). Thus the DCO would need to provide about a 700% increase (5.0/0.625=8.0, which is 700% greater than the minimum normalized frequency of 1.0) in frequency above the F(0) frequency.

Typical DCOs provide switchable circuits that provide equal sized steps in frequency, where the amount of a frequency step is proportional to a width W of a transistor, to generate the range of output frequencies. A large number of equal sized transistors is required to cover the required range of output frequencies thereby increasing the size and power requirements of the integrated circuit (IC) implementing the DCO. Using the exponentially increasing steps as described above allows for fewer switchable circuits to cover a desired frequency range.

Figure 6:
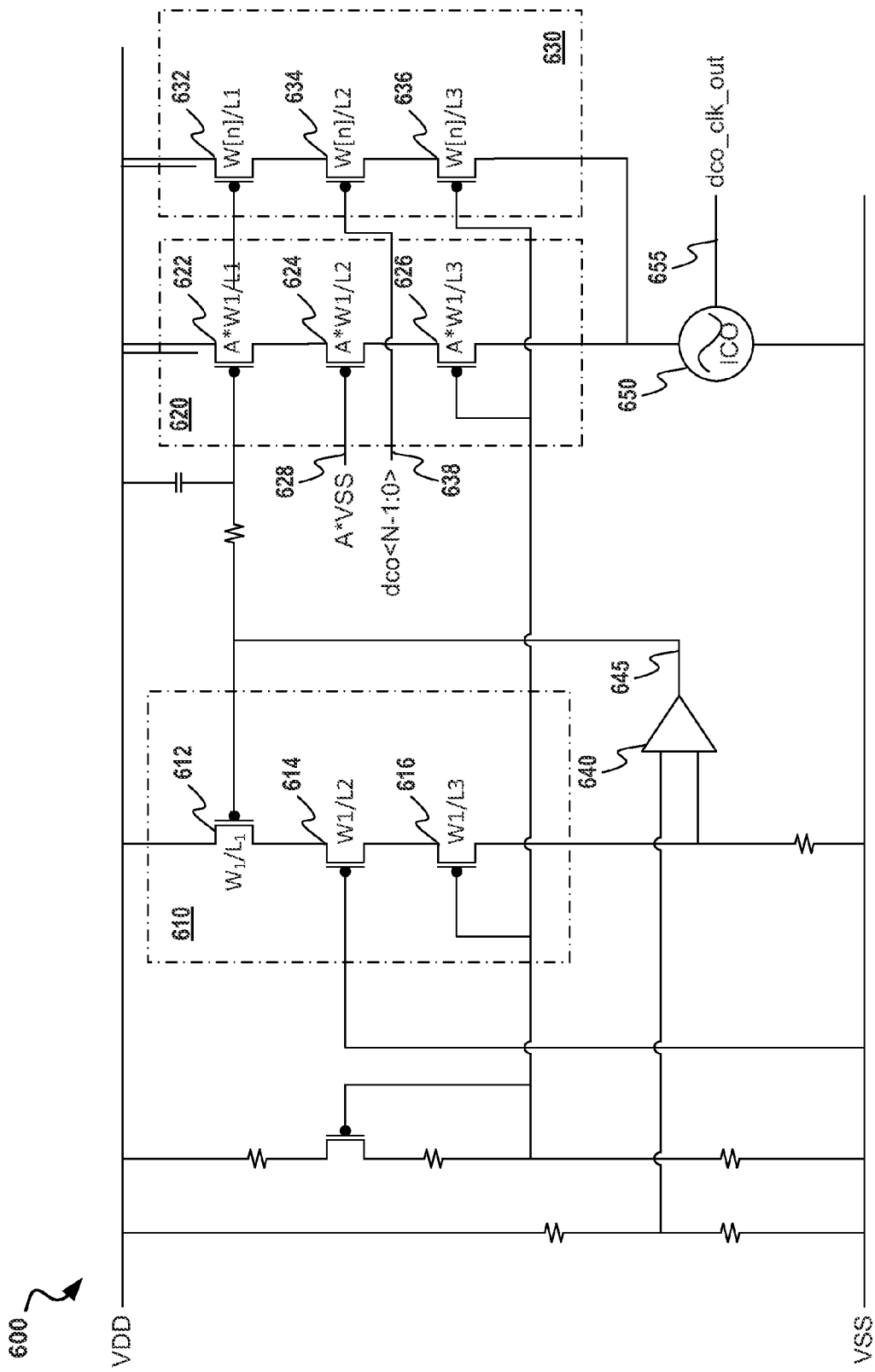
FIG. 6 illustrates another block diagram of an exemplary variable current DCO that utilizes a switchable DAC array having frequency steps that increase in magnitude as a target output clock frequency increases.
Figure 7A:
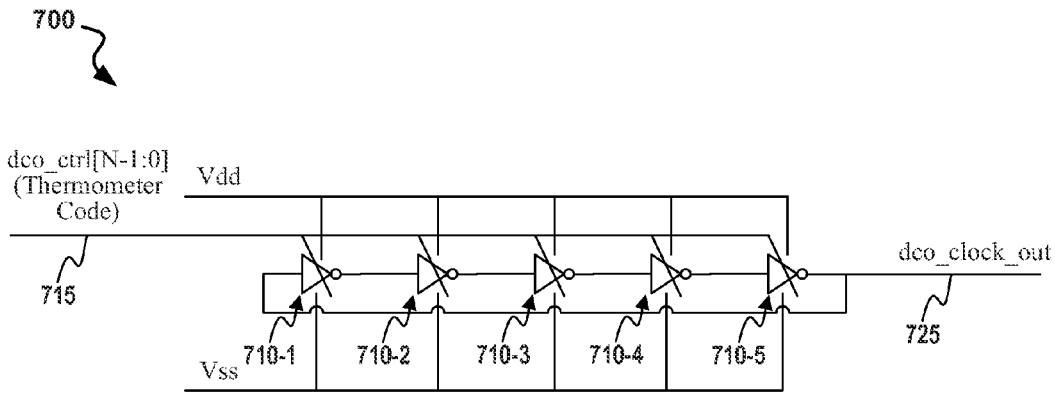
FIG. 7A illustrates a block diagram of an exemplary variable gate strength DCO that utilizes a ring oscillator that includes variable inverter stages having frequency steps that increase in magnitude as a target output clock frequency increases.
Figure 7B:
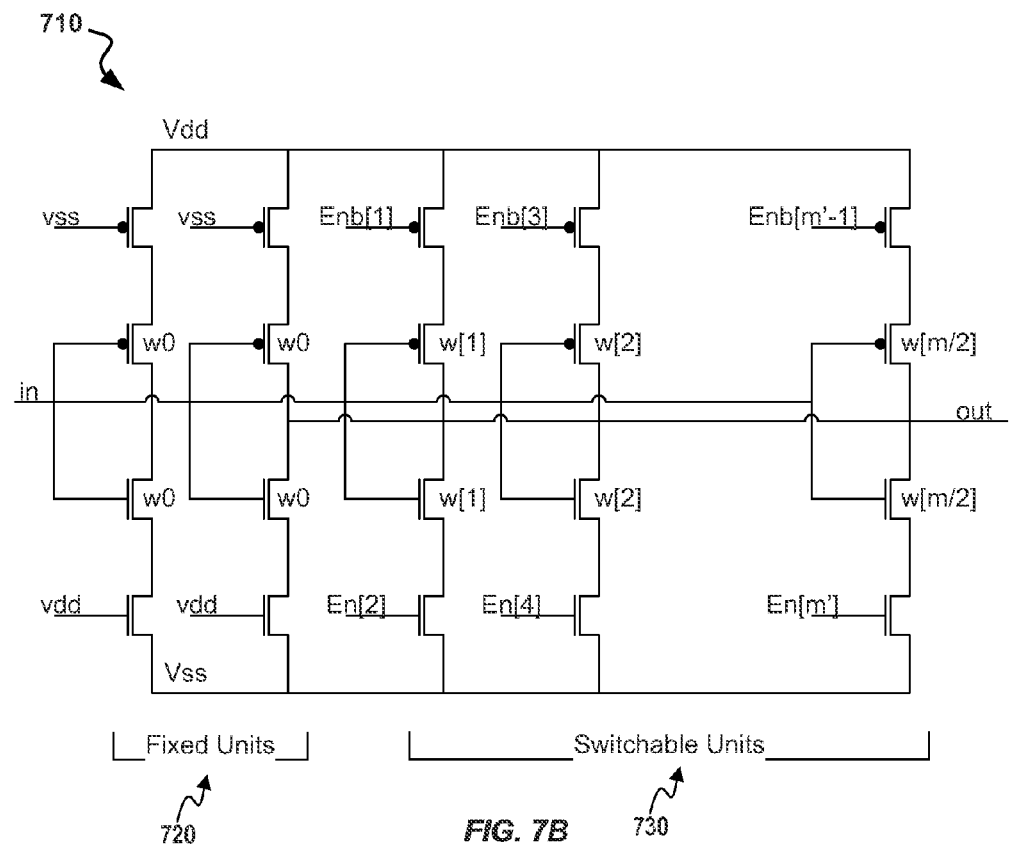
FIG. 7B illustrates a block diagram of an exemplary variable inverter stage having frequency steps that increase in magnitude as a target output clock frequency increases.

FIG. 6 illustrates another block diagram of an exemplary variable current DCO 600 that utilizes a switchable DAC array having frequency steps that increase in magnitude as a target output clock frequency increases. The variable current source DCO 600 can be used, for example, as the DCO 350 of the DPLL 300 and/or the DCO 350 of the acquisition-phase DPLL 400.

The variable current DCO 600 includes a mirror current transistor circuit 610 that includes, in this exemplary embodiment, a mirror current transistor 612, a mirror switch transistor 614 (an always-on switch transistor in this example) and a mirror cascade transistor 616. The mirror switch transistor 614 is, in this example, a low-true control that is closed when receiving a ground voltage VSS. The mirror current transistor 612, the mirror switch transistor and the mirror cascade transistor 616 each have a width of W1 in this embodiment and lengths of L1, L2 and L3, respectively. The width W1 and lengths L1, L2 and L3 are determined using integrated circuit theory.

The variable current DCO 600 also includes a fixed current source unit array 620. The fixed current source unit array 620 includes an integer number "A" transistor units that each include a fixed current transistor 622, a fixed switch transistor (an always on switch) 624 and a fixed cascade transistor 626. Each of the A fixed switch transistors 624 is, in this example, a low-true control that is closed when receiving a ground voltage VSS and FIG. 6 depicts a fixed array input voltage 628 equal to a voltage of A*VSS. Each of the A fixed current transistors 622, the A fixed switch transistors 624 and the fixed cascade transistors 626 has a width W1, in this example, and lengths L1, L2 and L3 as in the mirror current transistor unit 610. An operational amplifier (opamp) 640 supplies a voltage 645 to the mirror current transistor unit 610 and the fixed current source unit array 620 such that a current supplied to an ICO 650 causes the ICO 650 to create a DCO clock output 655 equal to the F(0) frequency. The F(0) frequency will depend on the PVT operating conditions that the variable current DCO 600 is experiencing.

The variable current DCO 600 also includes a switchable current source unit array 630. The switchable current source unit array 630 includes an integer number "N" transistor units that each include a current transistor 632, a switch transistor 634 and a cascade transistor 636. The switch transistors 634 are low-true switch transistors that are selectively enabled by a DCO control word 638. The DCO control word 638 can use, in this example, a thermometer code. The DCO control word 638 can be determined by the modulator 340 of the DPLL 300 or a modulator within the exponential current source 445 of the acquisition-phase DPLL 400.

A typical variable current DCO may use switchable current transistor units with equal widths W1 which are the same widths as the fixed current transistor units and the mirror current transistor unit. In this case, each of the equal width current transistor units (both fixed and switchable, in this example), would contribute an equal increase in current and therefore an equal increase in the DCO output frequency 655 of the ICO 650, referred to as Fstep. When all the switch transistors 634 are open, the equal step DCO would produce an F(0) frequency equal to Fstep*A. Each of the switchable transistors of the equal step DCO would also contribute Fstep in frequency and therefore, the DCO output frequency F(x) resulting from the first through $x_{th}$ switch transistors being closed would be given by the following expression:

$$F(x)=F\text{step}*(A+x) \tag{6}$$

The gain of this equal step DCO, Kdco is equal to Fstep. Since the frequency contribution of each equal width transistor unit is dependent on the PVT conditions, the gain Fstep can vary a great deal (almost 4:1 in typical PVT ranges) across the PVT range. This means that the loop filters used in a DPLL utilizing an equal step DCO would have to compensate for this variation in Kdco and Fstep. In contrast, the widths of the transistors in the switchable current source unit array 630 can be sized exponentially such that the Kdco gain is independent of PVT, as is described below.

The variable current DCO 600 utilizes, in this example, a switchable current source unit array 630 with transistor widths that increase exponentially. For example, a first of the N switchable current source units of the switchable current source unit array 630 may have one or more transistors with a width equal to W[0], a second switchable current source unit may have transistors with a width W[1]=W[0]+W[0]*δ, where δ is a fraction such as 0.01, for example. In this way, each successive switchable current source unit provides a slightly larger increase in current than the preceding switchable current source unit and hence causes the ICO 650 output frequency to increase by a slightly larger frequency step. By utilizing ever increasing transistor widths, the variable current DCO 600 can cover a given frequency range with fewer switchable current source units than an equal width DCO (as illustrated in Table 1 and described above).

In one exemplary variable current DCO 600, the A fixed current source units utilize transistors with widths equal to W1, which may be the same width as the transistors of the transistors in the mirror current transistor unit 610. In this example, the widths W[n} of the $n_{th}$ transistors in the N switchable current source units of the switchable current source unit array 630 could be given by the following formula:

$$W[n]=\delta*(A*W1+\Sigma(W[0],W[1]\ldots W[n-1]), \text{ for } 0\le n\le N-1 \tag{7}$$

The A fixed current source units each contribute Fstep increase in frequency of the ICO 650 and therefore, the F(0) frequency is given by the following formula:

$$F(0)=F\text{step}*A \tag{8}$$

Since the first switchable current source unit has a width that is a fraction δ larger than the summed widths of all A fixed current source units, and each successive switchable current source unit has a width that is larger than the preceding switchable current source unit, the output frequencies with one or more switch transistors 634 closed are given by the following formulae:

$$F(1)=F(0)*(1+\delta) \tag{9}$$

$$F(2)=F(1)*(1+\delta)=F(0)*(1+\delta)^2 \tag{10}$$

$$F(n)=F(0)*(1+\delta)^n \tag{11}$$

If one chooses a value α such that $e^\alpha=(1+\delta)$, then formula (11) reduces to the following:

$$F(n)=F(0)*e^{\alpha*n} \qquad (12)$$

Thus, the gain, Kdco, of the variable current DCO 600, with exponentially increasing transistor widths, is given by the following formula:

$$Kdco=F(n)*e^{\alpha*n}, \text{ for } 0 \leq n \leq N-1 \qquad (13)$$

This means that the Kdco is independent of PVT and hence the gains, Ki, Kp and Ka of the loop filter 330 described above can remain constant for a given target frequency for the entire range of PVT. Optimal loop gains Ki, Kp and Ka can be determined at typical conditions, and these optimal gains can be used under all conditions, with little or no change in loop dynamics.

In addition to providing the variable current DCOs 500 and 600 described above, a DCO that utilizes variable inverter units can also be modified to include exponentially increasing frequency steps. FIG. 7A illustrates a block diagram of an exemplary variable gate strength DCO 700 that utilizes a ring oscillator that includes variable inverter stages having frequency steps that increase in magnitude as a target output clock frequency increases.

The variable gate strength DCO 700 includes variable inverter stages 710-1, 710-2, 710-3, 710-4 and 710-5. The variable gate strength DCO 700 is illustrated with five variable inverter stages 710, but other embodiments can have fewer or more variable inverter units 710. Each of the variable inverter stages 710 has "m" enable bits. These "m" enable bit may be interleaved, in this example, into "N=m*5" thermometer coded control bits of a DCO control word 715.

The variable inverter units 710 are controlled by the DCO control word 715 to selectively enable and disable switches within the variable inverter units 710 to control the frequency of the DCO clock output 725. FIG. 7B illustrates a block diagram of an exemplary variable inverter stage 710 having frequency steps that increase in magnitude as a target output clock frequency increases. The inverter stage 710 includes a number of fixed inverter units 720 that are always enabled. The inverter stage 710 also includes a number of switchable inverter units 730 that are selectively enabled and disabled by enable bits Enb[n] that may be contained in the DCO control word 715. The switchable inverter units 730, in this example, each have one always-on NMOS transistor, one always-on PMOS transistor, one switchable NMOS transistor and one switchable PMOS transistor. Other exemplary variable inverter units may have different numbers and types of transistors.

The fixed inverter units 720, in this example, may include NMOS and PMOS transistors that each have a fixed width of w0. The widths w0 and the number of fixed inverter units 720 in each of the variable inverter units 710 are chosen such that the output frequency is low enough such that the lowest frequency output by the variable gate strength DCO 700 can be low enough to provide a minimum frequency at the fast corner of the PVT.

The switchable inverter units 730, have widths that vary exponentially in a similar fashion as the transistors in the switchable current source transistor array 630 described above. The widths can be determined using a formula similar to the formula 7 above. The number of switchable inverter units 730 needed to cover a range of frequencies for an entire PVT can be reduced compared to the number of switchable inverter units needed for equal width transistors. The number of fixed inverter units 720 and variable inverter units 730 can be increased or decreased depending on the requirement of the DCO being implemented.

Figure 8:
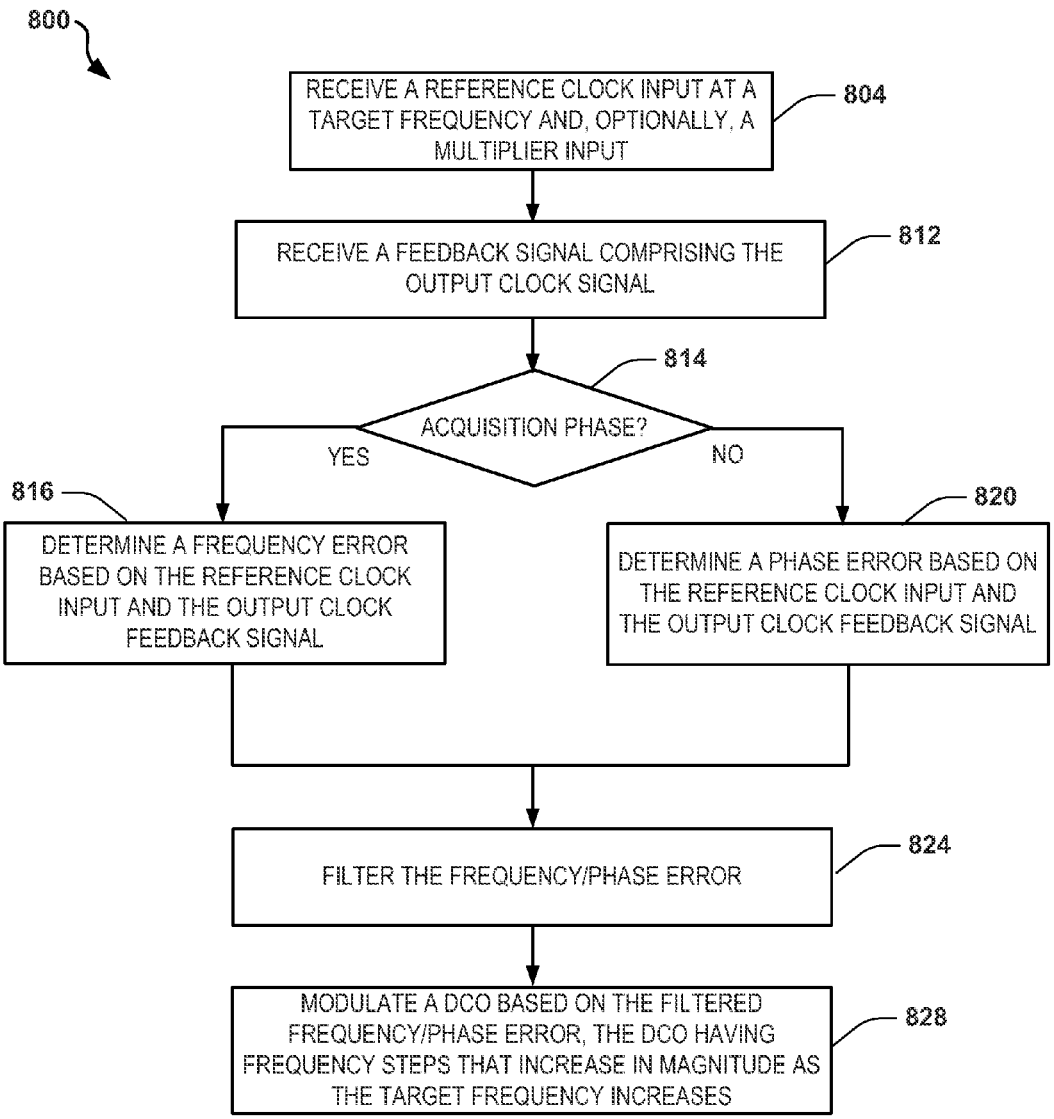
FIG. 8 illustrates a flow chart of an exemplary process utilizing a digitally controlled oscillator having frequency steps that increase in magnitude as a target output clock frequency increases.

FIG. 8 illustrates a flow chart of an exemplary process 800 utilizing a digitally controlled oscillator having frequency steps that increase in magnitude as a target output clock frequency increases. The process 800 is exemplary only and stages can be rearranged, added or omitted, depending on the embodiment. The process 800 will be described with further reference to FIGS. 3 and 4.

At 804, a phase locked loop (e.g., one of the DPLL 300 or the acquisition phase DPLL 400) receives the reference clock input 314 at a target frequency and may receive the multiplier input (N) 312. At 812, the DPLL receives the DCO clock output 352 as a feedback signal. At 814, the DPLL determines if the DPLL is in an acquisition mode based on the freq_acquire signal 324. If freq_acquire equals one, the process 800 proceeds to 816. If freq_acquire equals zero, the process 800 proceeds to 820. At 816, the acquisition phase DPLL 400 performs the functions described above in reference to FIG. 4 to produce the DCO clock output 352 based on the reference clock input 314 and the multiplier input 312, if the multiplier input 312 is received. The counter 410, the DPLL combiner 420, and the logarithm computation 430 compute the frequency error 432 based on the received reference clock input 314, the multiplier input 312 and a feedback indication of the DCO clock output 352. The loop filter 330 filters the frequency error signal 432 such that the DCO 350 can be controlled to match the target frequency. The DCO 350 can be any of the DCOs 500, 600 or 700 discussed above in reference to FIGS. 5, 6, 7A and 7B.

Upon producing a DCO clock output 352 that is close to the target frequency, the process 800 continues to 820 and execution of the DPLL 300 is initiated. The DPLL 300 continues to receive the reference clock input 314 and the multiplier input 312. At 820, the DPLL determines the phase error 332 based on the feedback signal, the reference clock input 314 and the multiplier input 312, if the multiplier input 312 was received at 804. The phase accumulator 310 and the TDC 360 perform functions as described above. At 820, the multiplexer 325 forwards the phase error to the loop filter 330.

At 824, the loop filter 330 filters the phase error or the frequency error (one of which is contained in the combined error signal 328) and forwards the resulting filtered error 332 to the modulator 340. At 828, the modulator 340 modulates the DCO 350 based on the filtered frequency error 332. During modulation at 828, the modulator 340 derives a DCO control word to cause the DCO 350 to counter the filtered frequency error 332. The DCO control word can be determined based on a DCO that can produce different magnitude frequency steps in response to the DCO control word 342. The different magnitude frequency steps can increase exponentially such that as the target frequency is increased, the frequency steps increase in magnitude.

It should be noted that the present disclosure includes various diagrams that may depict an example architectural or other configuration for the various embodiments, which is done to aid in understanding the features and functionality that can be included in embodiments. The present disclosure is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement various embodiments. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

It should be understood that the various features, aspects and/or functionality described in one or more of the individual embodiments are not limited in their applicability to the particular embodiment with which they are described, but instead can be applied, alone or in various combinations, to one or more of the other embodiments, whether or not such embodiments are described and whether or not such features, aspects and/or functionality are presented as being a part of a described embodiment. Thus, the breadth and scope of the present disclosure should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the terms "example" or "exemplary" are used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

Moreover, various embodiments described herein are described in the general context of method steps or processes, which may be implemented in one embodiment by a computer program product, embodied in, e.g., a non-transitory computer-readable memory, including computer-executable instructions, such as program code, executed by computers in networked environments. A computer-readable memory may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

As used herein, the term module can describe a given unit of functionality that can be performed in accordance with one or more embodiments. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality. Where components or modules of the disclosure are implemented in whole or in part using software, in one embodiment, these software elements can be implemented to operate with a computing or processing module capable of carrying out the functionality described with respect thereto. The presence of broadening words and phrases such as "one or more," "at least," "but not limited to" or other like phrases in some instances shall not be read to mean that the narrower case is intended or required in instances where such broadening phrases may be absent.

What is claimed is:

1. An integrated circuit comprising:
   a plurality of first transistor circuits fixedly coupled to an input voltage;
   a plurality of second transistor circuits switchably coupled to the input voltage; and
   an output electrically coupled to the plurality of second transistor circuits and the plurality of first transistor circuits to convey an output signal having a frequency dependent on which of the second transistor circuits are enabled, an increase in the frequency of the output signal due to enabling of a selected one of the second transistor circuits being proportional to a width of transistors in the selected one of the second transistor circuits
   a current mirror circuit connected between power supply terminals of the integrated circuit;
   a voltage divider connected between the power supply terminals; and
   an operational amplifier configured to provide a predetermined current to the plurality of first transistor circuits fixedly coupled to the input voltage in order to set a base frequency of the output signal,
   wherein the operational amplifier samples a voltage of the current mirror circuit and a voltage at a midpoint of the voltage divider in order to provide the predetermined current to the plurality of first transistor circuits.

2. The integrated circuit of claim 1, wherein the plurality of first transistor circuits and the plurality of second transistor circuits comprise current sources, the integrated circuit further comprising:
   a current controlled oscillator coupled to the first transistor circuits, the second transistor circuits and the output, the current controlled oscillator receiving current from the first transistor circuits and enabled second transistor circuits and providing the output signal to the output.

3. The integrated circuit of claim 1, wherein the plurality of first transistor circuits and the plurality of second transistor circuits comprise gates that invert a voltage applied thereto.

4. The integrated circuit of claim 3, wherein the plurality of first transistor circuits and the plurality of second transistor circuits are part of a variable inverter.

5. The integrated circuit of claim 4, wherein the variable inverter is part of a ring oscillator.

6. The integrated circuit of claim 1, further comprising:
an oscillator coupled to the first transistor circuits and the second transistor circuits and the output, wherein:
the plurality of first transistor circuits units cause the oscillator to produce a first clock signal at a first frequency F(O),
the first switchable transistor circuit, when enabled while the first switchable transistor circuit is enabled, causes the oscillator to produce a second clock signal at a second frequency $F(1)=F(O)*(1+\delta)$, and
the second switchable transistor circuit, when enabled, causes the oscillator to produce a second clock signal at a third frequency $F(2)=F(O)*(1+\delta)^2$.

7. The integrated circuit according to claim 1, wherein the plurality of second transistor circuits include
a first switchable transistor circuit having at least one transistor of a first width,
a second switchable transistor circuit having at least one transistor of a second width greater than the first width, and
a third switchable transistor circuit having at least one transistor of a third width that is greater than the second width.

8. The integrated circuit according to claim 7, wherein the second width is $(1+\delta)$ times greater than the first width, the third width is $(1+\delta)$ greater than the second width, and a magnitude of $\delta$ is less than one.

9. The integrated circuit according to claim 1, wherein the operational amplifier further provides the predetermined current to the current mirror circuit.

10. The integrated circuit according to claim 9, wherein the current mirror circuit includes a current mirror transistor connected to a first power supply terminal, a mirror switch transistor connected to the current mirror transistor, and a mirror cascade transistor connected to the mirror switch transistor and to a second power supply terminal.

11. The integrated circuit according to claim 10, wherein the operational amplifier provides the predetermined current to a control terminal of the current mirror transistor.

12. The integrated circuit according to claim 10, further comprising:
a resistor connected between the mirror cascade transistor of the current mirror circuit and the second power supply terminal,
wherein the operational amplifier samples the voltage of the current mirror circuit at a point between the mirror cascade transistor and the resistor.

13. The integrated circuit according to claim 1 wherein the plurality of first transistor circuits each include a fixed current transistor connected to a first power supply terminal of the integrated circuit, a fixed switch transistor connected to the fixed current transistor, and a fixed cascade transistor connected to the fixed switch transistor and a second power supply terminal of the integrated circuit.

14. The integrated circuit according to claim 13, wherein a control terminal of the fixed switch transistor is coupled to the input voltage.

15. The integrated circuit according to claim 13, wherein the operational amplifier provides the predetermined current to a control terminal of the fixed current transistor.

16. The integrated circuit according to claim 13, wherein the fixed current transistor, the fixed switch transistor and the fixed cascade transistor have a same width.

17. A method for an integrated circuit comprising:
receiving an input voltage at a plurality of first transistor circuits fixedly coupled to the input voltage;
receiving the input voltage at a plurality of second transistor circuits switchably coupled to the input voltage;
setting a base frequency for an output signal of the integrated circuit using an operational amplifier that provides a predetermined current to the plurality of first transistor circuits; and
changing a frequency of the output signal to a value greater than the base frequency by enabling one or more of the plurality of second transistor circuits,
wherein each of the plurality of second transistor circuits include at least one transistor of a different width than a corresponding transistor on others of the second transistor circuits,
the frequency of the output signal is proportional to widths of the transistors of the plurality of second transistor circuits, and
the operational amplifier provides the predetermined output current by sampling a voltage of a current mirror connected between power supply terminals of the integrated circuit and sampling a midpoint of a voltage divider connected between the power supply terminals.

18. The method according to claim 17, further comprising:
turning on a switch transistor in one or more of the second transistor circuits in order to enable a corresponding transistor circuit.

* * * * *